(12) United States Patent
Hassan et al.

(10) Patent No.: US 10,725,324 B2
(45) Date of Patent: Jul. 28, 2020

(54) PHOTONIC TRANSMITTER

(71) Applicant: Commissariat A L'Energie Atomique et aux Energies Alternatives, Paris (FR)

(72) Inventors: Karim Hassan, Grenoble (FR); Yohan Desieres, Grenoble (FR); Bertrand Szelag, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/517,716

(22) Filed: Jul. 22, 2019

(65) Prior Publication Data

US 2020/0026105 A1   Jan. 23, 2020

(30) Foreign Application Priority Data

Jul. 23, 2018 (FR) .................................. 18 56780

(51) Int. Cl.
*G02F 1/035* (2006.01)
*G02F 1/017* (2006.01)
(Continued)

(52) U.S. Cl.
CPC .......... *G02F 1/01708* (2013.01); *H01S 5/026* (2013.01); *H01S 5/0215* (2013.01);
(Continued)

(58) Field of Classification Search
CPC .. G02F 1/225; G02F 1/2255; G02F 2001/212; G02F 1/035; G02F 1/0356; G02F 1/01708
See application file for complete search history.

(56) References Cited

U.S. PATENT DOCUMENTS 9,285,540 B2 * 3/2016 Bauters ................ H01L 31/105
9,703,125 B2 7/2017 Fujikata et al.
(Continued)

FOREIGN PATENT DOCUMENTS

EP 3 206 079 A1 8/2017
FR 3 041 116 A1 3/2017
(Continued)

OTHER PUBLICATIONS

French Preliminary Search Report dated May 22, 2019 in French Application 18 56780, filed on Jul. 23, 2018 (with English Translation of Categories of Cited Documents & Written Opinion).
(Continued)

*Primary Examiner* — Jennifer Doan
(74) *Attorney, Agent, or Firm* — Oblon, McClelland, Maier & Neustadt, L.L.P.

(57) ABSTRACT

A photonic transmitter is provided, including a laser source including a first waveguide made of silicon and a second waveguide made of III-V gain material, the waveguides being separated from each other by a first segment of a dielectric layer; and a phase modulator including a first electrode made of single-crystal silicon and a second electrode made of III-V crystalline material, separated from each other by a second segment of the dielectric layer, where a thickness of the dielectric layer is between 40 nm and 1 µm, where a thickness of a dielectric material in an interior of the first segment is equal to the thickness of the dielectric layer, and where a thickness of the dielectric material in an interior of the second segment is between 5 nm and 35 nm, a rest being formed by a thickness of semiconductor material.

10 Claims, 4 Drawing Sheets

(51) Int. Cl.
*H01S 5/02* (2006.01)
*H01S 5/026* (2006.01)
*H01S 5/042* (2006.01)
*H01S 5/22* (2006.01)
*H01S 5/34* (2006.01)
*H01S 5/343* (2006.01)

(52) U.S. Cl.
CPC .............. *H01S 5/0421* (2013.01); *H01S 5/22* (2013.01); *H01S 5/3412* (2013.01); *H01S 5/3432* (2013.01); *G02F 2001/01791* (2013.01); *G02F 2201/06* (2013.01); *G02F 2202/101* (2013.01); *G02F 2202/105* (2013.01); *G02F 2202/108* (2013.01); *G02F 2203/50* (2013.01)

(56) References Cited

U.S. PATENT DOCUMENTS

| | | | |
|---|---|---|---|
| 2014/0307997 A1* | 10/2014 | Bar | H01L 21/8258 385/14 |
| 2016/0291350 A1 | 10/2016 | Fujikata et al. | |
| 2017/0237229 A1 | 8/2017 | Menezo | |

FOREIGN PATENT DOCUMENTS

| | | |
|---|---|---|
| WO | WO 2014/155450 A1 | 10/2014 |
| WO | WO 2018/029414 A1 | 2/2018 |

OTHER PUBLICATIONS

Park, H. et al. "Device and Integration Technology for Silicon Photonic Transmitters", IEEE Journal of Selected Topics in Quantum Electronics, vol. 17, No. 3, 2011, pp. 671-688.

Ben Bakir, B, et al. "Electrically driven hybrid Si/III-V Fabry-Perot lasers based on adiabatic mode transformers", Optics Express, vol. 19, No. 11, 2011, pp. 10317-10325.

Ben Bakir, B. et al. "Heterogeneously Integrated III-V on Silicon Lasers", ECS Transactions 64 (5), 2014, pp. 211-223.

Davenport, M. et al. "Heterogeneous Silicon/III-V Semiconductor Optical Amplifiers", IEEE Journal of Selected Topics in Quantum Electronics, vol. 22, No. 6, 2016, 11 pages.

Dong, P. et al. "Novel integration technique for silicon/III-V hybrid laser", Optics Express, vol. 22, No. 22, 2014, pp. 26861-26868.

Duan, G. et al "Hybrid III-V on Silicon Lasers for Photonic Integrated Circuits on Silicon", IEEE Journal of Selected Topics in Quantum Electronics, vol. 20, No. 4, 2014, 13 pages.

Duan, G, et al. "Hybrid III-V Silicon Photonic Integrated Circuits for Optical Communication Applications", IEEE Journal of Selected Topics in Quantum Electronics, vol. 22, No. 6, 2016, 11 pages.

Duprez, H. et al. "1310 nm hybrid InP/InGaAsP on silicon distributed feedback laser with high side-mode suppression ratio", Optics Express, vol. 23, No. 7, 2015, pp. 8489-8497.

Ferrotti, T. et al. "O-Band III-V-on-Amorphous-Silicon Lasers Integrated with a Surface Grating Coupler", IEEE Photonics Technology Letters, vol. 28, No. 18, 2016, pp. 1944-1947.

Han, J. et al. "Efficient low-loss InGaAsP/Si hybrid MOS optical modulator", Nature Photonics, vol. 11, 2017, pp. 486-491.

Sun, X. et al. "Adiabaticity criterion and the shortest adiabatic mode transformer in a coupled-waveguide system", Optics Letters, vol. 34, No. 3, 2009, pp. 280-282.

Szelag, B. et al "Hybrid III-V/Si DFB laser integration on a 200 mm fully CMOS-compatible silicon photonics platform", IEDM17, 2017, pp. 585-588.

Szelag, B. et al. "Multiple wavelength silicon photonic 200mm R&D platform for 25Gb/s and above applications", 2016, 15 pages.

Yariv, A, et al. "Supermode Si/III-V hybrid lasers, optical amplifiers and modulators: A proposal and analysis", Optics Express, vol. 15, No. 15, 2007, pp. 9147-9151.

* cited by examiner

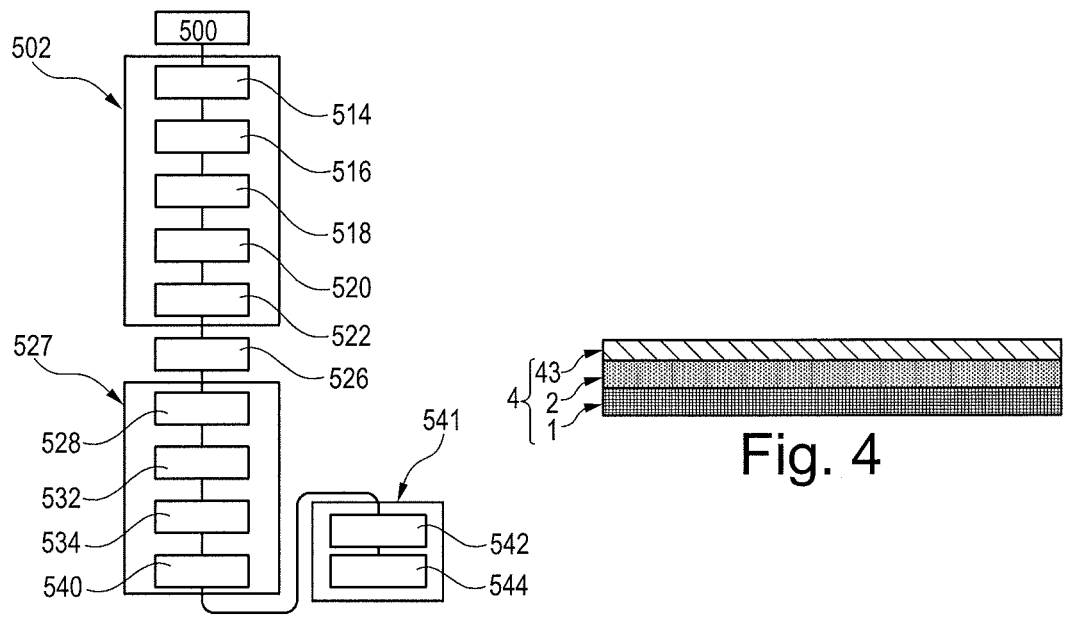
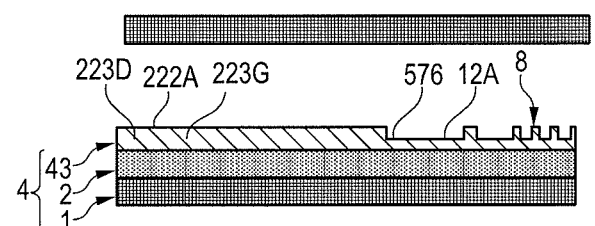
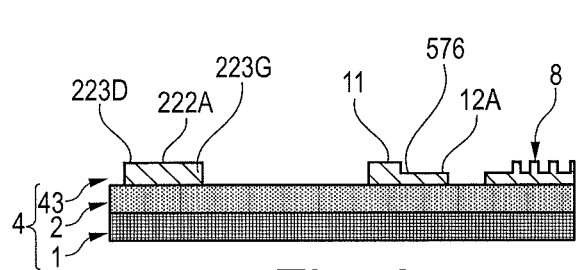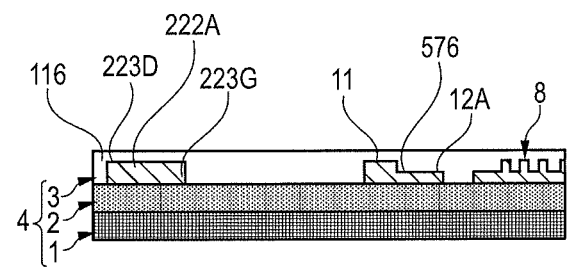

PHOTONIC TRANSMITTER

The invention relates to a photonic transmitter comprising a laser source and a modulator. Another subject of the invention is a process for fabricating this transmitter.

Known photonic transmitters comprise:
- a stack comprising a substrate mainly lying in a plane called the "plane of the substrate" and the following layers successively stacked one on top of the other and each mainly lying parallel to the plane of the substrate:
  - a first layer located directly on the substrate and comprising single-crystal silicon encapsulated in a dielectric material,
  - a second layer located directly on the first layer and comprising a dielectric material,
  - a third layer located directly on the second layer and comprising a III-V gain material and a doped III-V crystalline material, which materials are encapsulated in a dielectric material,
- a semiconductor laser source able to generate an optical signal, this laser source comprising:
  - a first waveguide made of silicon structured in the single-crystal silicon of the first layer, and
  - a second waveguide made of III-V gain material structured in the III-V gain material of the third layer, the first and second waveguides being optically coupled to each other by adiabatic coupling and being separated from each other to this end by a first segment of the second layer,
- a phase modulator produced on the same substrate and able to modulate the optical signal generated by the semiconductor laser source, this modulator comprising:
  - a first electrode made of n- or p-doped single-crystal silicon a first portion of which is structured in the single-crystal silicon of the first layer,
  - a second electrode made of doped III-V crystalline material structured in the doped III-V crystalline material of the third layer, the doping of this second electrode being of opposite type to that of the first electrode, said second electrode being separated from the first electrode by a second segment of the second layer.

Such a transmitter is for example disclosed in application EP3206079A1.

Prior art is also known from:
- WO2018/029414A1,
- Hyundai Park et Al: "Device and Integration Technology for Silicon Photonic Transmitters", IEEE Journal of Selected Topics in Quantum Electronics, Vol. 17, N° 3, Jan. 1, 2011,
- FR3041116A1,
- WO2014/155450A1.

The invention described here aims to propose a transmitter having the same advantages as that of application EP3206079A1 while being simpler to fabricate.

One subject thereof is therefore such a transmitter.

Another subject of the invention is a process for fabricating the semiconductor photonic transmitter that is one subject of the present patent application.

The invention will be better understood on reading the following description, which is given merely by way of nonlimiting example with reference to the drawings, in which:

FIG. 3 is a flowchart of a first process for fabricating the transmitter of FIG. 1;

FIGS. 4 to 11 are schematic illustrations, in vertical cross section, of various fabrication states obtained during the implementation of the process of FIG. 3;

In these figures, the same references have been used to reference elements that are the same. In the rest of this description, features and functions well known to those skilled in the art are not described in detail.

Section I: Examples of Embodiments

Figure 1:
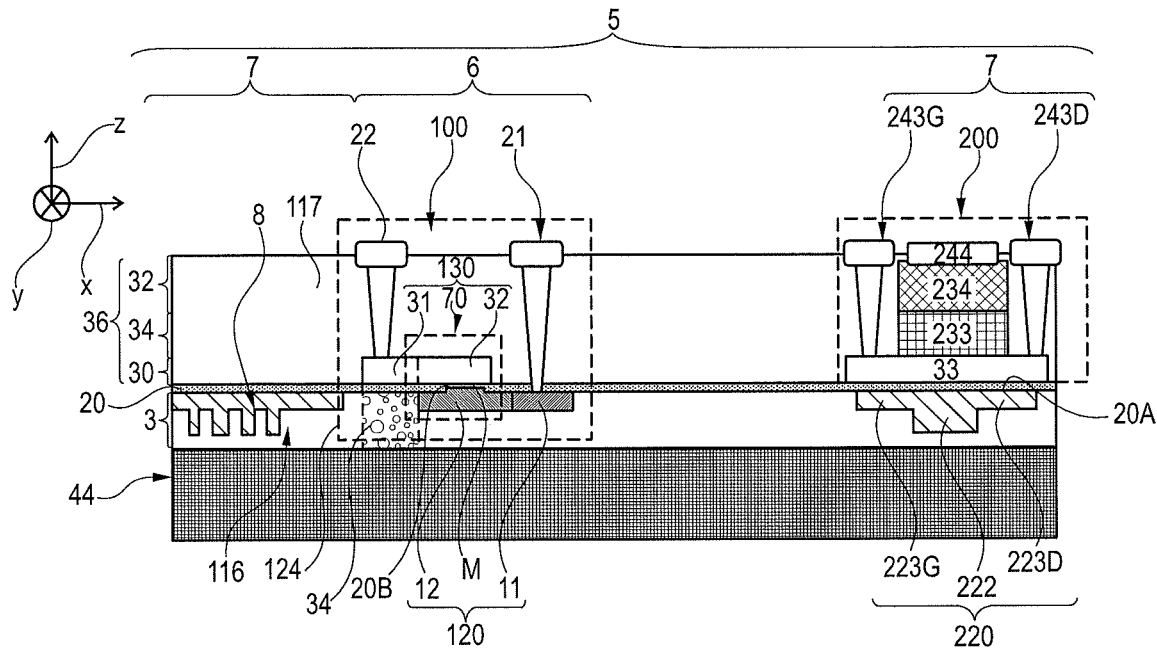
FIG. 1 is a schematic illustration of a transmitter in vertical cross section.

FIG. 1 shows a transmitter 5 of a phase- and/or amplitude-modulated optical signal for transmitting data bits to a receiver by way of an optical fibre for example. To this end, the transmitter 5 comprises a laser source 7 that emits an optical signal the phase and/or amplitude of which is then modulated by a system 6 for modulating the phase and/or amplitude of this optical signal.

For example, the wavelength $\lambda_{Li}$, of the optical signal emitted by the laser source 7 is comprised between 1240 nm and 1630 nm.

The system 6 may be a system for modulating a phase alone, or amplitude alone or phase and amplitude simultaneously.

Typically, the laser source 7 is a DBR laser (i.e. a distributed Bragg reflector laser) or a DFB laser (i.e. a distributed feedback laser). Such laser sources are well known and only details required to understand the invention will be described here. For example, for general details and a description of the operation of such laser sources, the reader may refer to the following articles:

B. Ben Bakir et al., "Hybrid Si/III-V lasers with adiabatic coupling", 2011.

B. Ben Bakir, C. Sciancalepore, A. Descos, H. Duprez, D. Bordel, L. Sanchez, C. Jany, K. Hassan, P. Brianceau, V. Carron, and S. Menezo, "Heterogeneously Integrated III-V on Silicon Lasers", Invited Talk ECS 2014.

To simplify FIG. 1 and the following figures, only a hybrid laser waveguide 200, 220 and a surface grating coupler 8 of the laser source 7 have been shown.

Such a coupler 8 is for example described in the following article: F. Van Laere, G. Roelkens, J. Schrauwen, D. Taillaert, P. Dumon, W. Bogaerts, D. Van Thourhout and R. Baets, "Compact grating couplers between optical fibers and Silicon-on-Insulator photonic wire waveguides with 69% coupling efficiency". It is produced in a layer 3 comprising single-crystal silicon encapsulated in a dielectric material 116. Generally, a dielectric material has an electrical conductivity at 20° C. lower than $10^{-7}$ S/m and, preferably, lower than $10^{-9}$ S/m or $10^{-15}$ S/m. In addition, in the case of the dielectric material 116, its refractive index is strictly lower than the refractive index of silicon. For example, in this embodiment, the dielectric material 116 is silicon dioxide ($SiO_2$).

The layer 3 mainly lies in a horizontal plane. The layer 3 is located directly on a rigid substrate 44. In the layer 3, the single-crystal silicon is located in a given horizontal plane parallel to the plane of the substrate 44. Here, the single-crystal silicon of the layer 3 is also mechanically and electrically insulated from the substrate 44 by the dielectric material 116. For example, the thickness of single-crystal silicon in the layer 3 is comprised between 100 nm and 800 nm. In this example, the thickness of the single-crystal silicon in the layer 3 is equal to 65 nm or 150 nm or 300 nm or 500 nm.

In FIG. 1 and in the following figures, the horizontal is represented by the directions X and Y of an orthogonal coordinate system. The direction Z of this orthogonal coordinate system represents the vertical direction. Below, terms such as "upper", "lower", "above", "below", "top" and "bottom" are defined with respect to this direction Z. The terms "left" and "right" are defined with respect to the direction X. The terms "front" and "back" are defined with respect to the direction Y.

FIG. 1 shows the elements of the transmitter 5 in cross-section in a vertical plane parallel to the directions X and Z.

The hybrid laser waveguide 200, 220 consists of a waveguide 200 made of a III-V gain material and a waveguide 220 made of single-crystal silicon. Generally, the waveguide 200 is used to generate and amplify an optical signal in the interior of an optical cavity of the laser source 7. Here, to this end, it is produced in a layer 36 comprising a III-V gain material encapsulated in a dielectric material 117. For example, the material 117 is silicon dioxide or silicon nitride. This layer 36 lies horizontally directly on a layer 20 made of dielectric material. The layer 20 itself lies horizontally directly on the layer 3, on the side of this layer 3 opposite the substrate 44.

The substrate 44 lies horizontally in a plane called the "plane of the substrate". In this example embodiment, the substrate 44 is a carrier the thickness of which is typically larger than 200 μm or 400 μm. For example, the substrate 4 is a carrier made of silicon.

The thickness $e_{20}$ of the layer 20 is typically comprised between 40 nm and 1 μm or 500 nm and, preferably, between 50 nm and 150 nm or between 50 nm and 140 nm. By way of illustration, here, the thickness $e_{20}$ is equal to 85 nm or 100 nm.

The layer 36 typically comprises a doped lower sublayer 30, a stack 34 of quantum wells or quantum dots in a quaternary material and an upper sublayer 32 doped with a dopant of opposite type to that of the sublayer 30. The sublayers 30 and 32 are for example here made of p- or n-doped single-crystal InP alloy. In this case, the stack 34 is, for example, a stack in alternation of sublayers made of InGaAsP or of AlGaInAs inter alia.

In FIG. 1, only a strip 33, a stack 233 and a strip 234 produced, respectively, in the sublayer 30, the stack 34 and the sublayer 32 have been shown. This superposition of the strip 33, of the stack 233 and of the strip 234 forms the waveguide 200.

The waveguide 200 also comprises:
contacts 243G and 243D making mechanical and electrical contact directly with the strip 33 and located, to the left and to the right of the stack 233, respectively, and
a contact 244 making mechanical and electrical contact directly with the strip 234.

These contacts 243G, 243D and 244 allow an electrical current to be injected into the waveguide 200 made of III-V gain material between the contacts 243G, 243D and the contact 244.

The waveguide 220 is made of silicon and structured in the single-crystal silicon of the layer 3. This waveguide 220 extends under the strip 33. In FIG. 1, the waveguide 220 is shown, by way of illustration, in the particular case where the propagation direction of the optical signal in the interior of this waveguide is parallel to the direction Y. Here, the waveguide 220 is a rib waveguide. Thus, the cross section of this waveguide, parallel to the XZ plane, has a central rib 222 from which extend, on each side, parallel to the direction X, thinner lateral arms 223G and 223D. Here, the waveguide 220 is separated from the strip 33 only by a segment 20A of the layer 20.

The waveguide 220 is optically connected to the waveguide 200 via adiabatic coupling. For a detailed description of adiabatic coupling, the reader may refer to the following article: Amnon Yariv et al., "Supermode Si/III-V hybrid Lasers, optical amplifiers and modulators: proposal and analysis" Optics Express 9147, vol. 14, No. 15, 23, Jul. 2007.

The characteristics of the optical coupling between the waveguide 220 and the waveguide 200 notably depend:
on the dimensions of the waveguide 220 and, in particular, the thickness $e_{222}$ of the central rib 222, and
on the thickness $e_{20A}$ of dielectric material in the segment 20A of the layer 20 interposed between the waveguides 200 and 220.

It is therefore important for the thicknesses $e_{222}$ and $e_{20A}$ to be able to be adjusted independently of the dimensions of the other photonic components produced on the same substrate 44. Here, to optimise the operation of the laser source 7, the thickness $e_{20A}$ is larger than 40 nm and, typically, comprised between 40 nm and 1 μm or between 40 nm and 500 nm. Here, the thickness $e_{20A}$ is equal to the thickness $e_{20}$ of the layer 20. With such a choice of the thickness $e_{20A}$, the coupling between the waveguides 200 and 220 is adiabatic. Under these conditions, preferably, only the waveguide 220 has tapered ends in order to ensure a good exchange of optical power between the waveguides 200 and 220.

Again to optimise the operation of the laser source 7, the thickness $e_{222}$ is larger than or equal to 220 nm or 300 nm. For example, here, the thickness $e_{222}$ is equal to 500 nm.

To modulate the phase or amplitude of the optical signal, the system 6 comprises at least one phase modulator and, often, at least one phase-tuning device. For example, the system 6 is a Mach-Zehnder interferometer in which the modulator and the phase-tuning device are arranged in one of the branches of this interferometer in order to modulate the amplitude and/or the phase of the optical signal generated by the laser source 7. The structures of a Mach-Zehnder interferometer and of a phase-tuning device are well known and are not described in detail here. The phase-tuning device is for example the same as that described in application EP3206079. Therefore, to simplify FIG. 1, only a phase modulator 100 has been shown.

The modulator 100 allows the phase of the optical signal to be rapidly modified. To this end, the modulator 100 is here an electro-optic modulator (EOM) and, more precisely, a hybrid capacitive modulator. It therefore comprises two electrodes 120 and 130 that are located facing each other and that form a capacitor.

The electrode 120 is made of doped single-crystal silicon. It is at least partially structured in the single-crystal silicon of the layer 3. It extends, in the direction X, from a near end 12 to a far end 11. It also extends in the direction Y.

Here, the far end 11 is more highly doped than the near end 12. For example, the dopant concentration in the far end 11 is comprised between $10^{19}$ and $10^{21}$ atoms/cm$^3$. The dopant concentration in the near end 12 is for example comprised between $10^{17}$ and $10^{19}$ atoms/cm$^3$.

The electrode 130 is made of doped III-V crystalline material that is doped the opposite type to the electrode 120. Here, it is made from InP. The dopant concentration of the electrode 130 is for example comprised between $10^{17}$ and $2\times10^{18}$ atoms/cm$^3$ or between $10^{17}$ and $2\times10^{19}$ atoms/cm$^3$.

The electrode 130 extends, parallel to the direction X, from a near end 32 to a far end 31. The electrode 130 also extends in the direction Y. It is located directly on the layer 20.

The near end 32 is located facing the near end 12 and separated from this near end 12 only by a segment 20B of the layer 20 interposed between these near ends. With respect to a vertical plane parallel to the directions Y and Z and passing through the near ends 12 and 32, the far end 31 is located on one side of this plane whereas the other far end 11 is located on the other side. The far ends 11 and 31 are therefore not facing.

The zone 34, which extends vertically from the far end 31 to the substrate 44, comprises solely solid dielectric materials. Here, it is a question of the dielectric material 116 and of the dielectric material of the layer 20. By virtue of this, the parasitic capacitance between this end 31 and the substrate 44 is greatly decreased. This zone 34 is, for example, identical to that described in application EP3206079.

The superposition, in the direction Z, of the near end 12, of the segment 20B of the layer 20 and of the near end 32 is dimensioned to form a waveguide 70, capable of guiding, in the direction Y, the optical signal generated by the laser source 7. The waveguide 70 is typically optically connected to the laser source 7 by way of other waveguides and of other couplers structured in the layer 3. To simplify FIG. 1, these other waveguides and other couplers have not been shown.

The modulator 100 also comprises two contacts 21 and 22, making mechanical and electrical contact directly with the far ends 11 and 31, respectively. These contacts 21 and 22 are connected to a voltage source that is controllable depending on the data bit or bits to be transmitted by the transmitter 5.

Figure 2:
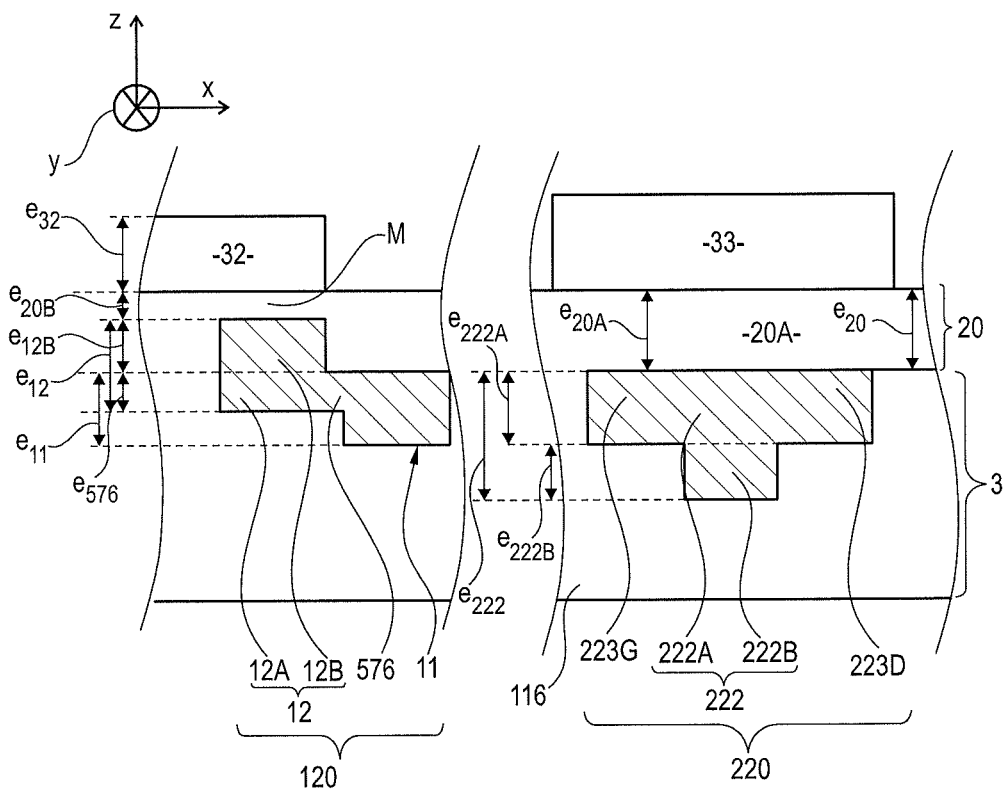
FIG. 2 is a partial schematic illustration, in vertical cross section, of details of the transmitter of FIG. 1.
Figure 8:
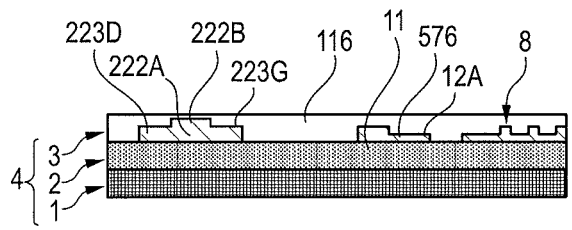
Figure 9:
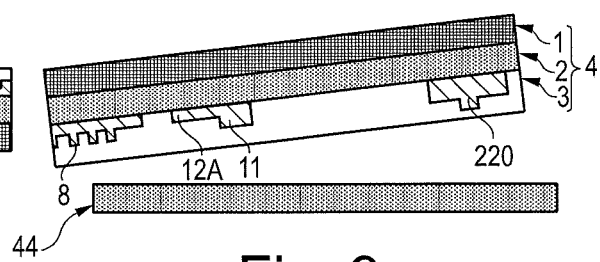
Figure 10:
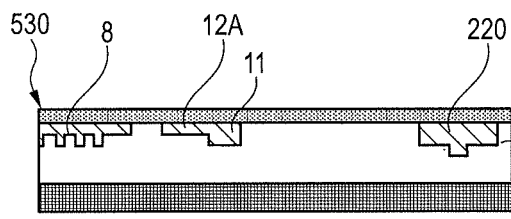

FIG. 2 shows in more detail the structure of the electrode 120 and of the waveguide 220. In this figure, the wavy lines indicate that portions of the transducer 5 have not been shown. In addition, to simplify the figure, the contacts 21, 22, 243G and 243D have not been shown.

The central rib 222 of the waveguide 220 comprises a central portion 222A on the lower face of which is directly deposited an additional thickness 222B of single-crystal silicon in order to achieve the desired thickness $e_{222}$. The limit between the central portion 222A and the additional thickness 222B has been represented in FIG. 2 by a dashed horizontal line. In this embodiment, the additional thickness 222B is also made of single-crystal silicon.

For example, here, the thickness $e_{222A}$ of the central portion 222A is equal to 300 nm and the thickness $e_{222B}$ of the additional thickness 222B is equal to 200 nm. Thus, the thickness $e_{222}$ of the rib 222 is equal to 500 nm. In this embodiment, the thickness $e_{223}$ of the lateral arms 223D and 223G is equal to the thickness $e_{222A}$, i.e. to 300 nm.

The far end 11 extends continuously from the interface between the layers 3 and 20 to a lower face buried in the interior of the layer 3. The thickness of the far end 11 is denoted $e_{11}$. Here, the thickness $e_{11}$ is equal to 300 nm. In this embodiment, the near end 12 and far end 11 are mechanically and electrically connected to each other by an intermediate portion 576 the thickness $e_{576}$ of which is strictly smaller than the thickness $e_{11}$ and than the thickness $e_{12}$ of the near end 12. The thickness $e_{576}$ is chosen so as to prevent or limit the propagation of the optical signal in the far end 11. For example, the thickness $e_{576}$ is smaller than or equal to $e_{12}/2$. Here, the difference between the thicknesses $e_{576}$ and $e_{11}$ is typically larger than 50 nm or 100 nm. Similarly, the difference between the thicknesses $e_{576}$ and $e_{12}$ is typically larger than 50 nm or 100 nm. To limit the number of etching levels, the thickness $e_{11}$ is equal to the thicknesses $e_{222A}$. Here, the thickness $e_{576}$ is equal to 65 nm. This configuration of the electrode 120 also allows the capacitance of the modulator to be better controlled.

The near end 12 is produced in two portions:
- a first portion 12A structured solely in the single-crystal silicon of the layer 3, and
- a second portion 12B made of single-crystal silicon produced in the interior of the segment 20B of the layer 20 and located directly on the portion 12A.

In FIG. 2, the limit between the portions 12A and 12B has been represented by a dashed horizontal line. The thickness of the portion 12B is denoted $e_{12B}$. This thickness is measured from the interface between the layers 3 and 20 to the upper face of the portion 12B buried in the interior of the layer 20.

In the interior of the segment 20B, because of the presence of the portion 12B, the thickness $e_{20B}$ of the dielectric material of the layer 20 that mechanically and electrically isolates the near ends 12 and 32 is smaller. Here, the thickness $e_{12B}$ is chosen so that the remaining thickness $e_{20B}$ of dielectric material is quite thin in order to obtain a good capacitive coupling between the electrodes 120 and 130. To this end, the thickness $e_{20B}$ is comprised between 5 nm and 35 nm. For example, the thickness $e_{20B}$ is here equal to 10 nm. The thickness $e_{12B}$ of the portion 12B is related to the thicknesses $e_{20B}$ and $e_{20}$ by the following relationship: $e_{12B}=e_{20}-e_{20B}$.

Here, to limit the number of etching levels of the single-crystal silicon of the layer 3, the thickness of the portion 12A is chosen equal to the thickness $e_{576}$.

In this embodiment, the thickness $e_{32}$ of the near end 32 of the electrode 130 is chosen to optimise the ratio of the optical phase shift to the optical loss. To do this, for example, various values of the thickness $e_{32}$ are simulated experimentally in order to determine which of these values allows this ratio to be optimised. For example, in the present case where the thicknesses $e_{12}$ and $e_{20B}$ are equal to 140 nm and 10 nm, respectively, it has been determined experimentally that the thickness $e_{32}$ that optimises this ratio is comprised between 80 nm and 100 nm. Here, the thickness $e_{32}$ is chosen equal to 90 nm.

One possible way in which the transmitter 5 may operate is the following. The laser source 7 generates an optical signal. At least one portion of this optical signal is directed to a Mach-Zehnder interferometer at least one of the branches of which comprises the modulator 100. This portion of the optical signal is therefore guided by the waveguide 70 before being recombined with another portion of the optical signal that is guided by the other branch of the Mach-Zehnder interferometer in order to form the modulated optical signal.

A process for fabricating the transmitter 5 will now be described with reference to FIGS. 3 to 11. FIGS. 4 to 11 show various states of fabrication of the transmitter 5 in vertical cross section parallel to the directions X and Z. To simplify these figures and the description of this process, the conventional steps and operations used to fabricate optical components other than those shown in FIG. 1 and necessary to the operation of the transmitter 5 have been omitted.

In a step 500, the process starts with provision of a substrate 4 (FIG. 4). Here, this substrate 4 is a silicon-oninsulator (SOI) substrate. The substrate 4 comprises stacked directly on top of one another in the direction Z:
- a carrier 1 made of silicon, of thickness larger than 400 μm or 700 μm conventionally,
- a buried layer 2 made of silicon dioxide, and
- a layer 43 made of single-crystal silicon that, at this stage, has not yet been etched or encapsulated in a dielectric material.

The thickness of the layer 2 is larger than or equal to the thickness $e_{12B}$. Here, the thickness of the layer 2 is therefore larger than 75 nm or 90 nm. For example, the thickness of the layer 2 is larger than 500 nm or 1 μm and, generally, smaller than 10 μm or 20 μm. In this example embodiment, the thickness of the layer 2 is equal to 800 nm.

The thickness of the layer 43 is here equal to the thickness $e_{11}$ or $e_{222A}$. It is therefore equal to 300 nm. In this embodiment, the thickness of the layer 43 is in contrast smaller than the desired thickness $e_{222}$.

In a step 502, the layer 3 is produced. To do this, the layer 43 is etched in order to structure the various optical-component portions located in the interior of the layer 3 and the thicknesses of which are smaller than or equal to the thickness of the layer 43. Thus, in this step 502, the arms 223D, 223G, the central portion 222A, the far end 11, the intermediate portion 576, the portion 12A of the near end 12 and the surface grating coupler 8 are structured in the layer 43 of single-crystal silicon.

For example, in an operation 514, the layer 43 undergoes a partial localised first etch (FIG. 5) in order to thin the thickness of the silicon in the locations required to produce the surface grating coupler 8, the intermediate portion 576 and the portion 12A of the near end 12. At the end of the operation 514, the thinned regions have a thickness equal to the thickness $e_{576}$.

In contrast, in this operation 514, other regions that are referred to as "non-thinned" regions are not etched and preserve their initial thickness. In particular, these non-thinned regions are located in the location of the central portion 222A of the rib 222, of the arms 223D and 223G and in the location of the far end 11.

In an operation 516, a complete localised etch of the layer 43 is carried out (FIG. 6). Contrary to the partial etch, the complete etch completely removes the thickness of silicon of the layer 43 in the unmasked regions to which it is applied. In contrast, masked regions protect the layer 43 from this complete etch. This complete etch is carried out so as to structure, simultaneously in the layer 43, the arms 223D, 223G, the central portion 222A, the far end 11, the intermediate portion 576 and the portion 12A of the near end 12 and the surface grating coupler 8. To this end, only the regions corresponding to these various elements are masked. At the end of this step, the state shown in FIG. 6 is obtained.

In an operation 518, the layer 43 of single-crystal silicon, which was structured in the preceding steps, is encapsulated in the dielectric material 116 (FIG. 7). At the end of the operation 518, the thickness of the layer 3 is equal to the thickness $e_{222}$, i.e. equal to 500 nm.

Next, in an operation 520, the additional thickness 222B is formed on the central portion 220A already structured in the preceding operations. Here, the additional thickness 222B is formed by implementing what is known as the damascene process. This process is for example described with reference to FIG. 3 of the following article: P. Dong et al.: "Novel integration technique for silicon/III-V hybrid laser", Optics Express 22(22), Vol. 22, N° 22, pp. 26861, 2014. To summarise, it consists in etching into the material 116 a trench the bottom of which opens onto the central portion 222A then in depositing or growing epitaxially single-crystal silicon in the interior of this cavity. Lastly, a polishing operation allows the excess of single-crystal silicon that was deposited or that was grown above and/or on the trench to be removed.

To finish production of the layer 3, in an operation 522, a new encapsulating operation is implemented in order to encapsulate the additional thickness 222B in the interior of the material 116.

The upper face of the material 116 is then prepared for bonding, for example direct or molecular bonding, i.e. bonding without addition of material. For example, the upper face of the material 116 is polished using a process such as chemical-mechanical polishing (CMP).

In a step 526, the upper face of the substrate 4, i.e. at this stage the polished face of the material 116, is then bonded to the exterior face of the substrate 44 (FIG. 9), for example, by direct bonding. The substrate 44 has already been described with reference to FIG. 1.

Next, in a step 527, the layer 20 is fabricated on the layer 3. To do this, in an operation 528, the carrier 1 is removed, and the layer 2 is partially thinned in order to leave behind only a thin sublayer 530 (FIG. 10) of silicon dioxide on the layer 3. The thickness of the sublayer 530 is equal to the thickness $e_{12B}$. Here, its thickness is therefore equal to 75 nm or 90 nm.

Figure 11:
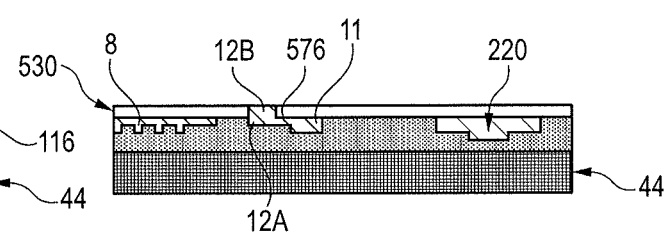

In an operation 532, the portion 12B of the far end 12 is formed on the portion 12A. For example, the portion 12B is produced by implementing a damascene process as in the operation 520. In this case, the trench is etched in the sublayer 530 and opens onto the upper face of the portion 12A already produced. The thickness of the portion 12B thus formed is equal to the thickness of the sublayer 530 and therefore equal to 75 nm or 90 nm. The state shown in FIG. 11 is then obtained.

In an operation 534, localised doping operations are implemented in order to obtain the various doping levels desired for the near and far ends 11, 12 of the electrode 120. Since these localised doping operations are conventional, they are not described here. Preferably, the electrode 120 is p-doped. Here, this doping is obtained by ion implantation of boron.

In an operation 540, the portion 12B is encapsulated in a second sublayer of dielectric material in order to finalise the production of the layer 20. For example, this dielectric material is silicon dioxide. Thus, at the end of this operation, the portion 12B is covered with a thickness $e_{20B}$ of silicon dioxide and the thickness of the segment 20A of the layer 20 now has a thickness $e_{20A}$ equal to the desired thickness. In this operation 540, the upper face of the layer 20 is also prepared for bonding, for example direct or molecular bonding. Thus, typically, the upper face of the layer 20 is polished using a process such as chemical-mechanical polishing (CMP).

Lastly, in a step 541, the layer 36 is fabricated.

In an operation 542, the electrode 130 and the waveguide 200 are produced on the upper face of the layer 20. Here, the electrode 130 and the waveguide 120 are produced by direct bonding two separate stacks made of III-V materials, one being used to produce the electrode 130 and another being used to produce the waveguide 200. The use of two separate stacks made of III-V material allows the thickness of the electrode 130 to be chosen independently of the thickness of the strip 33. Production of the electrode 130 and of the waveguide 200 by bonding and structuring stacks of III-V material is conventional and is not described in more detail here. For example, the interested reader may consult the following articles for examples of such techniques:

H. Duprez et al.: "1310 nm hybrid InP/InGaAsP on silicon distributed feedback laser with high side-mode suppression ratio", Optic Express 23(7), pp. 8489-8497 (2015), J.-H. Han et al.: "Efficient low-loss InGaAsP/Si hybrid MOS optical modulator", Nature Photonics 11, pp. 486 (2017).

In an operation 544, the electrode 130 and the waveguide 200 are encapsulated in the dielectric material 117. The layer 36 comprising, encapsulated in the dielectric material 117, the III-V gain material and the doped III-V material, is then obtained. Lastly, the contacts 21, 22, 243G and 243D are produced. The transmitter 5 such as shown in FIG. 1 is then obtained.

Figure 12:
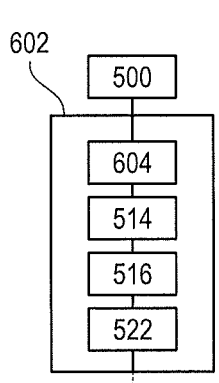
FIG. 12 is a partial flowchart of a second process for fabricating the transmitter of FIG. 1.

FIG. 12 shows a flowchart of a second possible process for fabricating the transmitter 5. The process of FIG. 12 is identical to the process of FIG. 3 except that:

the initial thickness of the layer 43 made of single-crystal silicon of the substrate 4 provided in step 500 is equal to 500 nm and no longer to 300 nm and the step 502 producing the layer 3 has been replaced by a step 602.

Figure 13:
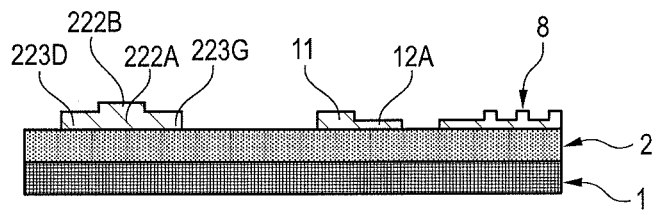
FIG. 13 is a schematic illustration, in vertical cross section, of a fabrication state obtained during the implementation of the process of FIG. 12.

Step 602 is identical to step 502 except that an additional localised etching operation 604 has been introduced before the localised etching operation 514. In the operation 604, the layer 43 undergoes a partial localised first etch in order to thin the thickness of the silicon everywhere except in the location of the additional thickness 222B. At the end of the operation 604, the thickness of the layer 43 is equal to 300 nm except in the location of the additional thickness 222B where its thickness is equal to 500 nm. Next, the operations 514 and 516 are carried out while taking care not to thin the thickness of the layer 43 in the location of the additional thickness 222B. Thus, at the end of the operations 604, 514 and 518, the state shown in FIG. 13 is obtained. In this embodiment, the additional thickness 222B is achieved by etching the layer 43. Thus, the operations 518 and 520 are omitted.

Subsequently, the steps of this process are identical to those already described with reference to FIG. 3. To simplify FIG. 12, they have not been shown and have been replaced by a dashed line.

Figure 14:
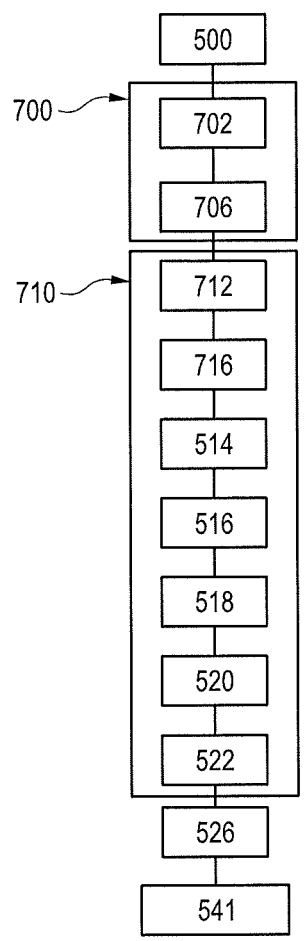
FIG. 14 is a flowchart of a third process for fabricating the transmitter of FIG. 1.

FIG. 14 shows a third possible process for fabricating the transmitter 5. This process starts with the production of the layer 20 before the production of the layers 3 and 36. In this process, steps and operations already described with reference to FIG. 3 are not described again.

Figure 15:
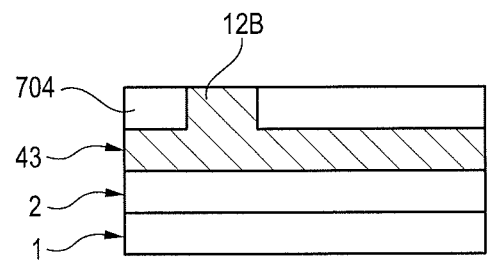
FIGS. 15 to 17 are schematic illustrations, in vertical cross section, of the various fabrication states obtained during the implementation of the process of FIG. 14.

After step 500, this process comprises a step 700 of producing the layer 20. For example, the step 700 starts with an operation 702 in which the portion 12B of the electrode is produced. Here, this operation 702 is identical to the operation 532. To this end, initially, in step 700, an oxide layer 704 (FIG. 15) the thickness of which is equal to the thickness $e_{12B}$ is produced on the upper face of the substrate 4. At the end of the operation 702, the state shown in FIG. 15 is obtained.

Next, in an operation 706, the produced portion 12B is encapsulated in silicon dioxide. For example, this step is identical to the operation 540 of the process of FIG. 3. Thus, at the end of step 700, the layer 20 immediately above the layer 43 is obtained.

Figure 16:
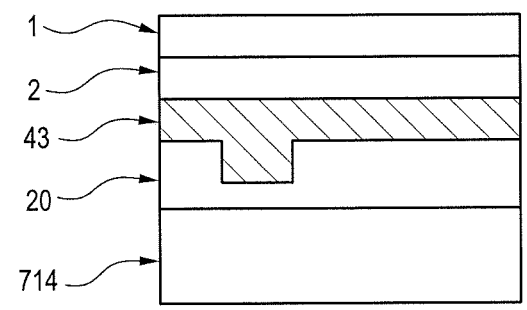

Next, in a step 710, the layer 3 is produced. To do this, in an operation 712, the upper face of the layer 20 is bonded, for example by direct bonding, to a substrate 714 made of amorphous silicon. The state shown in FIG. 16 is then obtained.

In an operation 716, the carrier 1 and the layer 2 are removed in order to uncover the layer 43 made of single-crystal silicon.

Next, the following operations are carried out:
the localised etching operation 514, then
the localised complete etching operation 516, then
the encapsulating operation 518, then
the operation 520 of forming the additional thickness 222B, then
the operation 522 of encapsulating the formed additional thickness 222B.

Figure 17:
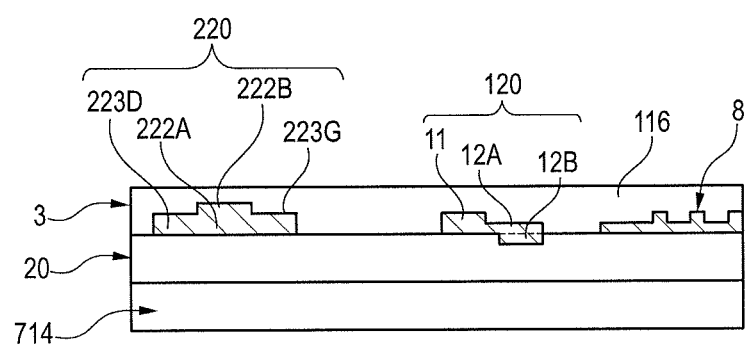

At the end of step 710, the state shown in FIG. 17 is obtained.

The upper face of the material 116 is then prepared for bonding, for example direct bonding.

The step 526 of bonding the upper face of the layer 36 to the upper face of the substrate 4 is then executed.

In a step 720, the substrate 714 is then removed in order to uncover the face of the layer 20.

Lastly, step 514 of fabricating the layer 36 on the layer 20 is executed.

Section II: Variants

Variants of the Electrode 120

The intermediate portion 576 may be separated from the layer 20 by a recess filled with a dielectric material. Typically, the recess is filled with the material 116. The bottom of this recess is essentially horizontal and spaced apart from the layer 20 by a depth $p_{578}$. The depth $p_{578}$ is typically larger than 50 nm or 100 nm. Here, the depth $p_{578}$ is equal to 65 nm. This configuration of the intermediate portion allows the width of the waveguide 70 to be better controlled. Such a configuration of the intermediate portion 576 and its fabrication are described in application EP3206079. It is therefore not described in more detail here.

The intermediate portion 506 may also be omitted.

In one variant, the doping of the near end 12 and of the far end 11 is the same. Thus, during the fabrication of the electrode 120, only a single step of doping the layer 43 made of single-crystal silicon is required.

The electrode 120 may also be n-doped. Such n-doping is for example obtained by ion implantation of phosphorus. In this case, the electrode 130 is p-doped.

The portions 12A and 12B of the far end 12 are not necessarily made from the same semiconductor material. For example, the portion 12B may be made from SiGe alloy or be formed by a superposition of layers made of silicon and of SiGe alloy. The portion 12B may also be made from amorphous silicon. For example, this additional thickness of amorphous silicon may be deposited on the single-crystal silicon using one of the processes described in the following articles:

T. Ferrotti et al., "O-band III-V-on-amorphous-silicon lasers integrated with a surface grating coupler", IEEE Phot. Technol. Lett. 28(18) pp. 1944, 2016, B. Szelag et al., "Hybrid III-V/Si DFB laser integration on a 200 mm fully CMOS-compatible silicon photonics platform", in Proc. of Electron Devices Meeting (IEDM), 2017 IEEE International, pp. 24.1, 2017.

Variants of the Electrode 130

The III-V material used to produce the electrode 130 may be different. For example, it may be a question of the alloy InP, the alloy GaAs, the alloy InGaAsP, or AlGaInAs or of a superposition of a plurality of these alloys.

In another embodiment, the electrode 130 is made from a III-V material different from that used to produce the strip 33.

The thickness $e_{32}$ may be chosen to be different. For example, as a variant, the thicknesses $e_{12}$ and $e_{32}$ of the near ends 12 and 32, respectively, are chosen so that the point at which the maximum strength of the optical field of the optical signal that propagates through the waveguide 70 is located is as close as possible to the thickness of dielectric material located in the interior of the segment 20B. Preferably, this point M is located at the centre of the thickness $e_{20B}$ of dielectric material of the segment 20B. Specifically, it is at the interfaces between the near ends 12, 32 and the dielectric material of the segment 20B that the charge carrier density is maximum when a potential difference is present between the near ends 11 and 31. This therefore improves the effectiveness of the modulator 100. For example, to this end, in the case where the refractive indices of the near ends 12 and 32 are close to each other, the thicknesses $e_{12}$ and $e_{32}$ are also chosen to be substantially equal. For example, the thickness $e_{12}$ is comprised between $0.5e_{32}$ and $1.5e_{32}$, and, preferably, between $0.7e_{32}$ and $1.3e_{32}$.

Variants of the Laser Source

As a variant, the additional thickness 222B is omitted. In this case, the maximum thickness of the waveguide 220 is equal to the thickness of the layer 43.

As a variant, the additional thickness 222B is made of amorphous silicon and not of single-crystal silicon. In this case, the additional thickness is deposited on the single-crystal silicon, not by epitaxial growth but by deposition.

Other III-V gain materials may be used to produce the laser source 7. For example, the layer 36 is formed from the following stack from the bottom upwards:
 a lower sublayer made of n-doped GaAs,
 sublayers containing AlGaAs quantum dots, or AlGaAs quantum wells, and
 an upper sublayer made of p-doped GaAs.

The waveguide 220 may have a so-called "strip" configuration, i.e. the lateral arms 223G and 223D are omitted, or any other configuration capable of guiding an optical signal.

Other Variants of the Modulator

The modulator 100 may also be a ring modulator. To this end, the waveguide 70 loops back onto itself in order to form a ring waveguide in which the charge carrier density may be modified depending on the potential difference applied between the contacts 21 and 22. Typically, this ring waveguide is connected to a waveguide through which the optical signal to be modulated propagates via evanescent coupling. The waveguide 70 may also form only a limited segment of the ring waveguide.

In another embodiment, the modulator is used to modulate the intensity of the optical signal that passes therethrough. Specifically, a modification of the charge carrier density in the waveguide 70 also modifies the intensity of the optical signal passing therethrough.

Other dielectric materials are possible for the material 116 and the layer 20. For example, it may be a question of silicon nitride, aluminium nitride, an electrically insulating polymer, or $Al_2O_3$. In addition, in the case of the layer 20, its refractive index is not necessarily lower than that of silicon.

In another variant, the layer 20 is completely removed wherever it is not indispensable to the operation of the transmitter. For example, it is completely removed outside of the segments 20A and 20B.

Whatever the embodiment, it is possible to invert the p- and n-doped regions.

As a variant, some or all of the contacts are produced, not through the material 117, but through the substrate 44. In this case, with respect to what was shown in the preceding figures, one or more electrical contacts emerge under the substrate.

The substrate 44 may be made from a material other than silicon.

As a variant, the waveguides 70, 220 are curved. In this case, the configuration of the various elements optically coupled to these waveguides is adapted to the radius of curvature of these waveguides.

Variants of the Fabrication Process

Step 502 may comprise other operations in addition to the etching operations for structuring the optical-component portions in the layer 43 made of single-crystal silicon. For example, it may in addition comprise operations for doping the layer 43 locally. For example, these localised doping operations may be used to obtain the doping level required for the end 11 of the electrode 120. In this case, step 534 must be adapted accordingly.

As a variant, the electrode 130 and the waveguide 200 are produced from the same stack of III-V material bonded to the upper face of the layer 20. This stack is then structured to obtain the electrode 130 and the waveguide 200.

The insulating layer 20 may be obtained via different fabrication processes. For example, in the operation 528, the layer 2 is completely removed so as to uncover the layer 3, then the sublayer 530 is deposited on the uncovered layer 3. In this case, optionally, the dielectric material of the layer 20 may be different from the material 116. For example, it may be a question of a dielectric material such as an electrically insulating polymer or $Al_2O_3$. After the complete removal of the layer 2, it is also possible to produce the layer 20 by oxidising the surface of the layer 3.

The operation 540 of encapsulating the portion 12B may be carried out differently. For example, before the electrode 130 is bonded, the sublayer 30 made of III-V material is oxidised to form, after the bonding, the thickness $e_{20B}$ of oxide located above the portion 12B of the electrode 120.

In another variant, the localised complete second etch is replaced by a uniform etch of all the surface of the layer 3 in order to convert the non-thinned regions into thinned regions and to completely remove the thinned regions.

Section III: Advantages of the Described Embodiments

The thickness of dielectric material larger than 40 nm in the segment 20A allows the waveguide 220 and the waveguide 200 to be coupled adiabatically rather than evanescently. Adiabatic coupling is simpler to achieve than evanescent coupling. Advantageously, in the case of adiabatic coupling, it is not necessary to structure tapers in the waveguide 200 made of III-V material. In contrast, in the case of evanescent coupling, tapers must be structured in the waveguide 200. Now, depending on its thickness and the crystal orientations, structuring tapers in a waveguide made of III-V material is a complex operation to carry out. Thus, the fact that the thickness of dielectric material between the waveguides 200 and 220 is larger than 40 nm simplifies the fabrication of the transmitter. In particular, for this reason, the transmitter 5 is simpler to fabricate than that described in application EP3206079A1.

The fact that the thickness of dielectric material between the two electrodes 120 and 130 is smaller than 35 nm allows a hybrid capacitive modulator to be produced. If the thickness of dielectric material between the two electrodes 120 and 130 were larger, only an electro-absorption modulator (EAM) would be producible. Now, hybrid capacitive modulators have a passband that is much wider than is the case with electro-absorption modulators. Hybrid capacitive modulators are also advantageous with respect to non-hybrid capacitive modulators, in which the electrode 130 is also made of silicon. Specifically, hybrid capacitive modulators allow phase changes to be obtained 10 times to 100 times more effectively than with a non-hybrid capacitive modulator. Thus, the described transmitters have a performance that is equal to or better than that of the transmitter of application EP3206079A1.

Lastly, the fact that the thickness of dielectric material between the waveguides 200 and 220 and between the electrodes 120 and 130 is different, allows a transmitter to be obtained that has, at the same time, the various above advantages, i.e. that is simple to fabricate while incorporating, on the same substrate, a laser source and a hybrid capacitive modulator, and while achieving, both for the laser source and for the hybrid capacitive modulator, an optimised performance.

The fabrication processes described here allow the thickness of the dielectric material in the segment 20A to be adjusted independently of the thickness of dielectric material in the segment 20B of the layer 20. The described processes therefore allow, on the same substrate, both a semiconductor laser source and a hybrid capacitive modulator to be fabricated.

The fabrication processes described here in particular have the following advantages:

They allow the thickness of the layer 20 to be precisely controlled and a layer 20 that is particularly planar to be obtained because it is produced on the side of the layer 3, which has the same level everywhere, this simplifying the bonding of the stack made of III-V material used to produce the electrode 130 and the waveguide 200.

They allow the thickness of the electrode 120 to be precisely adjusted independently of the thickness of the waveguide 220 and, more generally, independently of the thickness of the layer 43 made of single-crystal silicon. This is particularly useful because, generally, to improve the operation of the laser source 7, it is necessary for the thickness of the waveguide 220 to be quite large, i.e. here of about 500 nm. In contrast, to improve the operation of the modulator 100, as explained above, the thickness of the electrode 120 and, in particular, of its near end 12 is generally smaller than the thickness $e_{222}$.

This process allows the formation of a parasitic capacitance under the far end 31 to be avoided and therefore allows a rapider operation of the modulator 100.

The invention claimed is:

1. A photonic transmitter, comprising:
a stack comprising a substrate and the following layers successively stacked one on top of the other and each mainly lying parallel to a plane of the substrate:
   a first layer disposed directly on the substrate and comprising single-crystal silicon encapsulated in a dielectric material,
   a second layer disposed directly on the first layer and comprising a dielectric material, and
   a third layer disposed directly on the second layer and comprising a III-V gain material and a doped III-V crystalline material, wherein the III-V gain material and the doped III-V crystalline material are encapsulated in a dielectric material;
a semiconductor laser source configured to generate an optical signal, the semiconductor laser source comprising:
   a first waveguide made of silicon structured in the single-crystal silicon of the first layer, and
   a second waveguide made of III-V gain material structured in the III-V gain material of the third layer, the first and second waveguides being optically coupled to each other by adiabatic coupling and being separated from each other by a first segment of the second layer, wherein in an interior of the first segment of the second layer, a thickness of the dielectric material is equal to a thickness of the second layer; and
a phase modulator produced on the substrate and configured to modulate an optical signal generated by the semiconductor laser source, the phase modulator comprising:
   a first electrode made of n-doped or p-doped single-crystal silicon, a first portion of which is structured in the single-crystal silicon of the first layer, and
   a second electrode made of doped III-V crystalline material structured in the doped III-V crystalline material of the third layer, a dopant of the second electrode being of opposite type to that of the first electrode, the second electrode being separated from the first electrode by a second segment of the second layer,
wherein:
   the thickness of the second layer is comprised between 40 nm and 1 μm, and
   in an interior of the second segment of the second layer, a thickness of the dielectric material is comprised between 5 nm and 35 nm, a rest of the thickness of the second layer in the interior of the second segment being formed by a thickness of semiconductor material directly disposed on the first portion of the first electrode and which forms a second portion of the first electrode, the thickness of semiconductor material being chosen from the group consisting of a thickness of silicon, a thickness of a SiGe alloy, and a superposition of thicknesses made of silicon and made of the SiGe alloy.

2. The photonic transmitter according to claim 1, wherein:
the doped III-V crystalline material of the third layer lies directly on the second layer,
the first electrode of the phase modulator extends, in a transverse direction parallel to the plane of the substrate, from a near end to a far end, and extends longitudinally in a propagation direction of the optical signal,
the second electrode of the phase modulator extends, in the transverse direction, from a near end located facing the near end of the first electrode to a far end located on a side opposite to the far end of the first electrode with respect to a plane perpendicular to the plane of the substrate and passing through the near ends, the second electrode also extending longitudinally in the propagation direction of the optical signal, and
the phase modulator further comprises contacts making direct mechanical and electrical contact with, respectively, the far ends of the first and the second electrodes in order to electrically connect the first and the second electrodes to different electrical potentials so as to modify a charge carrier density in an interior of a third waveguide formed by superposition of the near ends of the first and the second electrodes and the second segment of the second layer interposed between the near ends.

3. The photonic transmitter according to claim 2, wherein a maximum thickness of the near end of the first electrode is strictly smaller than a maximum thickness of the first waveguide.

4. The photonic transmitter according to claim 2, wherein a maximum thickness of the near end of the first electrode is comprised between $0.7e_{32}$ and $1.3e_{32}$, where $e_{32}$ is a maximum thickness of the near end of the second electrode.

5. The photonic transmitter according to claim 1, wherein the second electrode is made from a III-V material chosen from the group consisting of an InP alloy, a GaAs alloy, an InGaAsP alloy, and a superposition of a plurality of alloys of this group.

6. The photonic transmitter according to claim 2, wherein the phase modulator further comprises a zone solely composed of one or more solid dielectric materials that extend:
   in the direction perpendicular to the plane of the substrate, from the far end of the second electrode to the substrate, and
   in the transverse direction and in the propagation direction of the optical signal, under an entirety of the far end of the second electrode.

7. The photonic transmitter according to claim 1, wherein the second electrode lies directly on the second layer.

8. A process for fabricating a semiconductor photonic transmitter according to claim 1, the process comprising:
   producing a stack comprising a substrate and the following layers successively stacked one on top of the other and each mainly lying parallel to a plane of the substrate:
     a first layer disposed directly on the substrate comprising single-crystal silicon encapsulated in a dielectric material,
     a second layer disposed directly on the first layer and comprising a dielectric material, and
     a third layer disposed directly on the second layer and comprising a III-V gain material and a doped III-V crystalline material, wherein the III-V gain material and the doped III-V crystalline material are encapsulated in a dielectric material;
   producing a semiconductor laser source configured to generate an optical signal, the semiconductor laser source comprising:
     a first waveguide made of silicon structured in the single-crystal silicon of the first layer, and
     a second waveguide made of III-V gain material structured in the III-V gain material of the third layer, the first and second waveguides being optically coupled to each other by adiabatic coupling and being separated from each other by a first segment of the second layer, wherein in an interior of the first segment of the second layer, a thickness of the dielectric material is equal to a thickness of the second layer; and
   producing a phase modulator produced on the substrate and configured to modulate an optical signal generated by the semiconductor laser source, the phase modulator comprising:
     a first electrode made of n-doped or p-doped single-crystal silicon, a first portion of which is structured in the single-crystal silicon of the first layer, and
     a second electrode made of doped III-V crystalline material structured in the doped III-V crystalline material of the third layer, a dopant of the second electrode being of opposite type to that of the first electrode, the second electrode being separated from the first electrode by a second segment of the second layer,
   wherein the producing of the stack comprises producing the second layer with the following features:
     the thickness of the second layer is comprised between 40 nm and 1 µm, and
     in an interior of the second segment of the second layer, a thickness of the dielectric material is comprised between 5 nm and 35 nm, a rest of the thickness of the second layer in the interior of the second segment being formed by a thickness of semiconductor material directly disposed on the first portion of the first electrode and which forms a second portion of the first electrode, the thickness of semiconductor material being chosen from the group consisting of a thickness of silicon, a thickness of a SiGe alloy, and a superposition of thicknesses made of silicon and made of the SiGe alloy.

9. The process according to claim 8, wherein the producing of the second layer comprises:
   forming, on the single-crystal silicon of the first layer, a first sublayer made of dielectric material of thickness equal to a thickness desired for the second portion of the first electrode, then
   in a location of the second segment of the second layer, producing a trench in the first sublayer, a bottom of the trench opening onto the single-crystal silicon of the first layer, and not producing the trench in a location of the first segment of the second layer, then
   filling the trench with the semiconductor material in order to form the second portion of the first electrode, a thickness of which is equal to the thickness of the first sublayer, and then
   encapsulating, in a second sublayer made of dielectric material, the formed second portion, a thickness of the second sublayer being equal to a thickness of the dielectric material in the interior of the second segment.

10. The process according to claim 8, wherein the producing of the first waveguide of the semiconductor laser source comprises:
   etching a layer of single-crystal silicon in order to delineate, in the layer of single-crystal silicon, a central portion of the first waveguide, and then
   forming, on the central portion of the first waveguide, an additional thickness of silicon in order to locally increase a thickness of the first waveguide.

\* \* \* \* \*